(12) United States Patent
Cernea et al.

(10) Patent No.: US 7,173,854 B2
(45) Date of Patent: Feb. 6, 2007

(54) NON-VOLATILE MEMORY AND METHOD WITH COMPENSATION FOR SOURCE LINE BIAS ERRORS

(75) Inventors: Raul-Adrian Cernea, Santa Clara, CA (US); Siu Lung Chan, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/097,038

(22) Filed: Apr. 1, 2005

(65) Prior Publication Data

US 2006/0221693 A1 Oct. 5, 2006

(51) Int. Cl.
*G11C 11/34* (2006.01)
*G11C 16/04* (2006.01)
*G11C 16/24* (2006.01)
*G11C 16/26* (2006.01)

(52) U.S. Cl. .............. 365/185.12; 365/185.2; 365/238.5; 365/189.09; 365/185.03

(58) Field of Classification Search ........... 365/185.12, 365/185.2, 185.03, 220, 238.5, 185, 189.09
See application file for complete search history.

(56) References Cited

U.S. PATENT DOCUMENTS

| | | | |
|---|---|---|---|
| 4,357,685 A | 11/1982 | Daniele et al. | |
| 5,070,032 A | 12/1991 | Yuan et al. | |
| 5,095,344 A | 3/1992 | Harari | |
| 5,172,338 A | 12/1992 | Mehrotra et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,418,752 A | 5/1995 | Harari et al. | |
| 5,453,955 A | 9/1995 | Sakui et al. | |
| 5,570,315 A | 10/1996 | Tanaka et al. | |
| 5,595,924 A | 1/1997 | Yuan et al. | |
| 5,661,053 A | 8/1997 | Yuan | |
| 5,689,470 A | 11/1997 | Inoue | |
| 5,768,192 A | 6/1998 | Eitan | |
| 5,774,397 A | 6/1998 | Endoh et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Amir Zarabian
*Assistant Examiner*—Michael Weinberg
(74) *Attorney, Agent, or Firm*—Parsons Hsue de Runtz LLP

(57) ABSTRACT

Source line bias is an error introduced by a non-zero resistance in the ground loop of the read/write circuits. During sensing the source of a memory cell is erroneously biased by a voltage drop across the resistance and results in errors in the applied control gate and drain voltages. This error is minimized when the applied control gate and drain voltages have their reference point located as close as possible to the sources of the memory cells. In one preferred embodiment, the reference point is located at a node where the source control signal is applied. When a memory array is organized in pages of memory cells that are sensed in parallel, with the sources in each page coupled to a page source line, the reference point is selected to be at the page source line of a selected page via a multiplexor.

40 Claims, 16 Drawing Sheets

U.S. PATENT DOCUMENTS

| | | | |
|---|---|---|---|
| 5,903,495 | A | 5/1999 | Takeuchi et al. |
| 6,011,725 | A | 1/2000 | Eitan |
| 6,046,935 | A | 4/2000 | Takeuchi et al. |
| 6,055,190 | A | 4/2000 | Lu et al. |
| 6,118,702 | A * | 9/2000 | Shieh et al. ........... 365/185.21 |
| 6,125,052 | A | 9/2000 | Tanaka |
| 6,222,762 | B1 | 4/2001 | Guterman et al. |
| 6,373,753 | B1 | 4/2002 | Proebsting |
| 6,987,693 | B2 * | 1/2006 | Cernea et al. ......... 365/185.12 |
| 7,023,736 | B2 * | 4/2006 | Cernea et al. ......... 365/185.21 |
| 2004/0057287 | A1 | 3/2004 | Cernea et al. |
| 2004/0057318 | A1 | 3/2004 | Cernea et al. |
| 2004/0109357 | A1 | 6/2004 | Cernea et al. |
| 2005/0169082 | A1 * | 8/2005 | Cemea ....................... 365/218 |

OTHER PUBLICATIONS

EPO/ISA, "Notification of Transmittal of the International Search Report and the Written Opinion of the International Searching Authority, or the Declaration," mailed in corresponding International Application No. PCT/US2006/011675 on Jul. 26, 2006, 10 pages.

EPO/ISA, "Notification of Transmittal of the International Search Report and the Written Opinion of the International Searching Authority, or the Declaration," mailed in corresponding International Application No. PCT/US2006/011824 on Aug. 25, 2006, 11 pages.

* cited by examiner

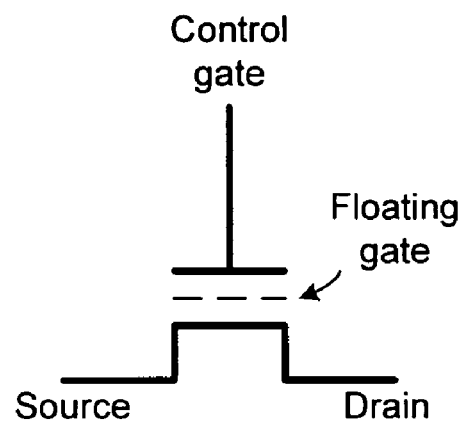
FIG. 1A *(Prior Art)*
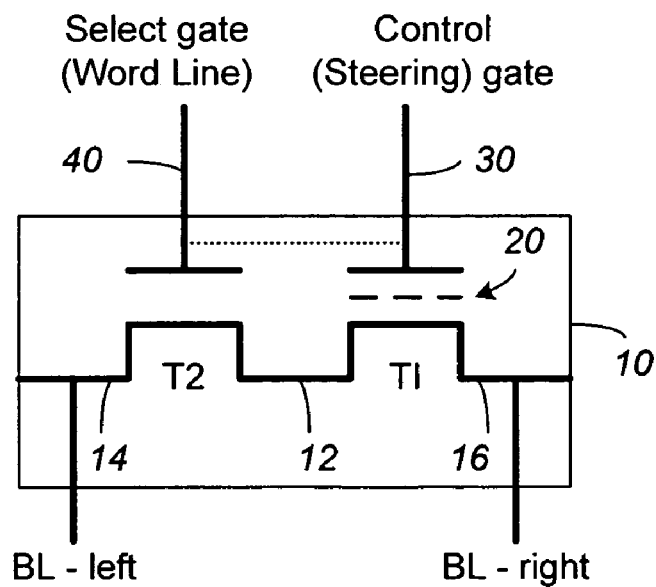
FIG. 1B *(Prior Art)*

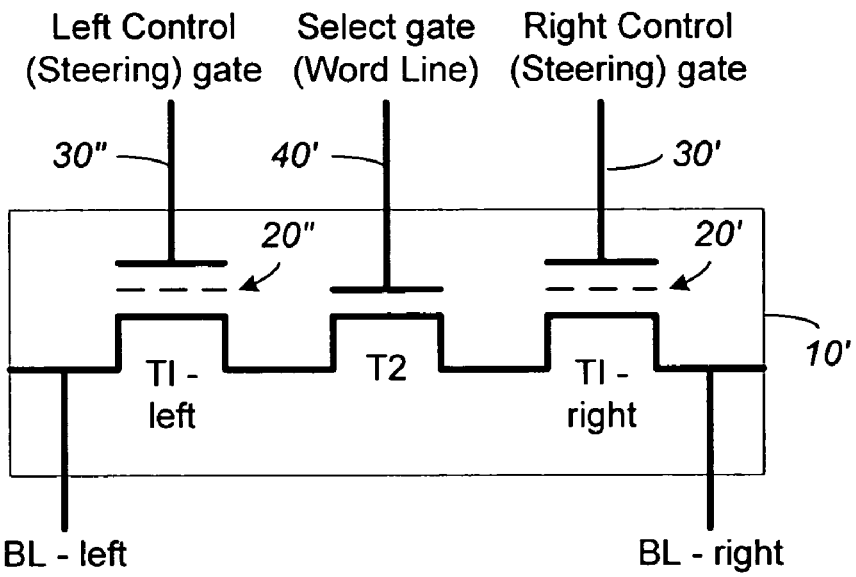
FIG. 1C *(Prior Art)*
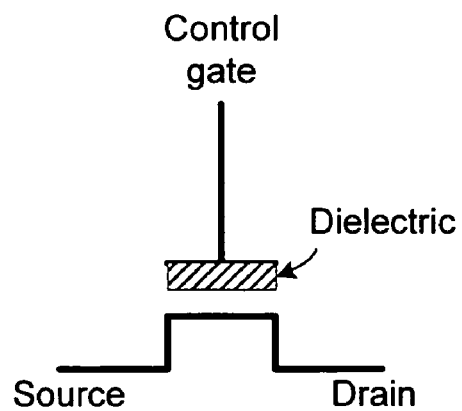
FIG. 1E *(Prior Art)*

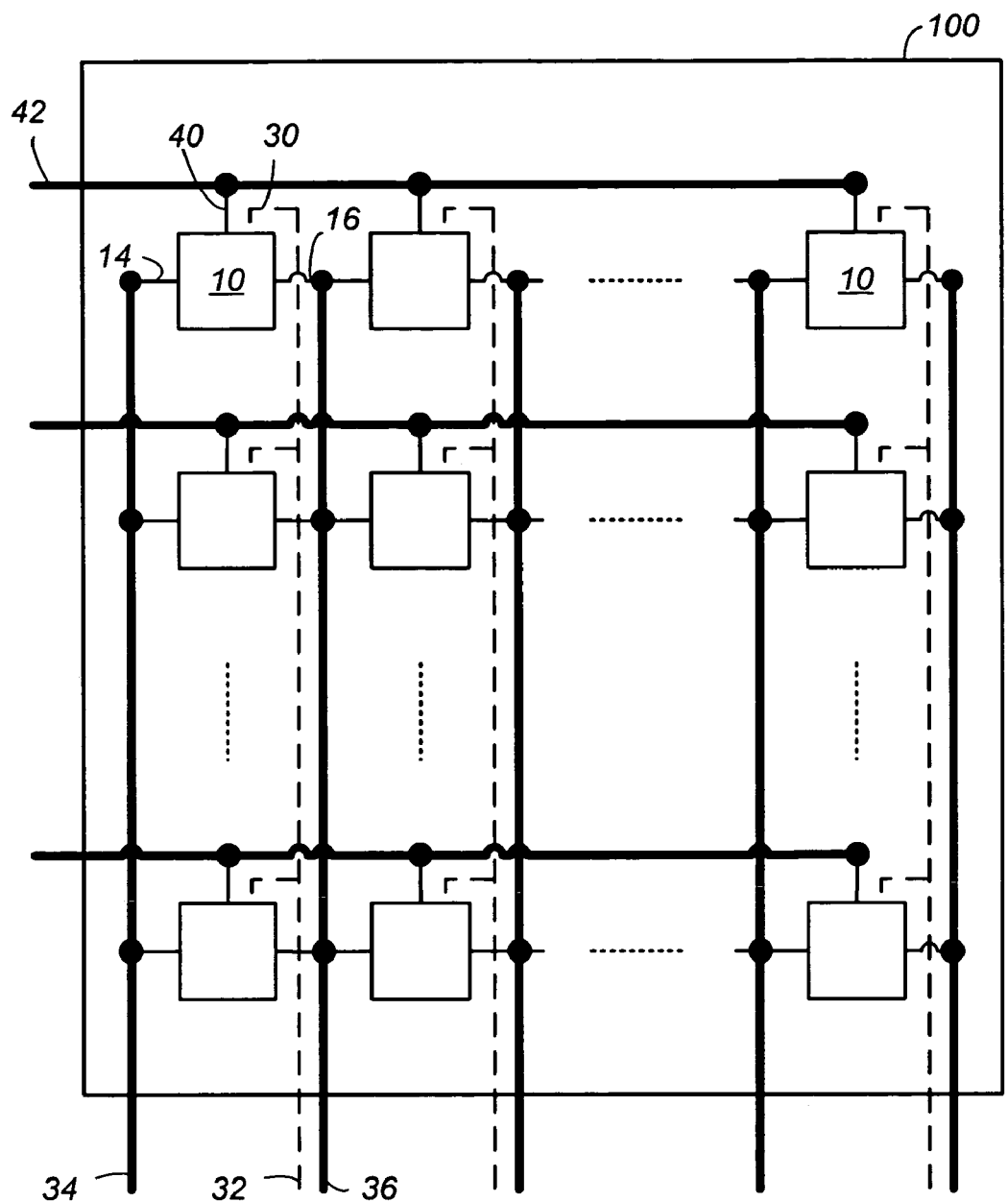
FIG. 2 *(Prior Art)*

NON-VOLATILE MEMORY AND METHOD WITH COMPENSATION FOR SOURCE LINE BIAS ERRORS

FIELD OF THE INVENTION

This invention relates generally to non-volatile semiconductor memory such as electrically erasable programmable read-only memory (EEPROM) and flash EEPROM, and specifically ones having improved sensing circuits that compensate for source bias errors due to a finite resistance in the ground loop.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A–1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1—left and T1—right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1—left is being accessed, both the T2 and T1—right are turned on to allow the current in the T—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND chain. An NAND chain 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND chain's source terminal 54 and drain terminal 56. In a memory array, when the source select transistor S1 is turned on, the source terminal is coupled to a source line. Similarly, when the drain select transistor S2 is turned on, the drain terminal of the NAND chain is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND chain via its source terminal 54 and drain terminal 56 respectively.

When an addressed memory transistor within an NAND chain is read and verified during programming, its control gate is supplied with an appropriate voltage. At the same time, the rest of the non-addressed memory transistors in the NAND chain 50 are fully turned on by application of sufficient voltage on their control gates. In this way, a conductive path is effective created from the source of the individual memory transistor to the source terminal 54 of the NAND chain and likewise for the drain of the individual memory transistor to the drain terminal 56 of the chain. Memory devices with such NAND chain structures are described in U.S. Pat. Nos. 5,570,315, 5,903,495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543–545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 30 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND chains, a bit line is coupled to the drain terminal 56 of each NAND chain. Along each row of NAND chains, a source line may connect all their source terminals 54. Also the control gates of the NAND chains along a row are connected to a series of corresponding word lines. An entire row of NAND chains can be addressed by turning on the pair of select transistors (see FIG. 1D) with appropriate voltages on their control gates via the connected word lines. When a memory transistor representing a memory cell within the NAND chain is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1–Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner on all even or all odd bit lines at a time. This "alternate-bit-line" architecture of a row consisting of two interleaved pages will help to alleviate the problem of accommodating the block of read/write circuits. It is also dictated by consideration of controlling bit-line to bit-line capacitive coupling. A block decoder is used to multiplex the set of read/write modules to either the even page or the odd page. In this way, whenever one set of bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

United States Patent Publication No. 2004-0057318-A1 discloses a memory device and a method thereof that allow sensing a plurality of contiguous memory cells in parallel. For example, all memory cells along a row sharing the same word lines are read or programmed together as a page. This "all-bit-line" architecture doubles the performance of the "alternate-bit-line" architecture while minimizing errors caused by neighboring disturb effects. However, sensing all bit lines does bring up the problem of cross-talk between neighboring bit lines due induced currents from their mutual capacitance. This is addressed by keeping the voltage difference between each adjacent pair of bit lines substantially independent of time while their conduction currents are being sensed. When this condition is imposed, all displacement currents due to the various bit lines' capacitance drop out since they all depend on a time varying voltage difference. The sensing circuit coupled to each bit line has a voltage clamp on the bit line so that the potential difference on any adjacent pair of connected bit lines is time-independent. With the bit line voltage clamped, the conventional method of sensing the discharge due to the bit line capacitance can not be applied. Instead, the sensing circuit and method allow determination of a memory cell's conduction current by noting the rate it discharges or charges a given capacitor independent of the bit line. This will allow a sensing circuit independent of the architecture of the memory array (i.e., independent of the bit line capacitance.) Especially, it allows the bit line voltages to be clamped during sensing in order to avoid bit line crosstalk.

As mentioned before, conventional memory devices improve read/write operations by operating in a massively parallel manner. This approach improves performance but does have repercussions on the accuracy of read and write operations.

One issue is the source line bias error. This is particular acute for memory architecture where a large number memory cells have their sources coupled together in a source line to ground. Parallel sensing of these memory cells with common source results in a substantial current through the source line. Owing to a non-zero resistance in the source line, this in turn results in an appreciable potential difference between the true ground and the source electrode of each memory cell. During sensing, the threshold voltage supplied to the control gate of each memory cell is relative to its source electrode but the system power supply is relative to the true ground. Thus sensing may become inaccurate due to the existence of the source line bias error.

United States Patent Publication No. 2004-0057287-A1 discloses a memory device and a method thereof that allow sensing a plurality of contiguous memory cells in parallel. The reduction in source line bias is accomplished by read/write circuits with features and techniques for multi-pass sensing. When a page of memory cells are being sensed in parallel, each pass helps to identify and shut down the memory cells with conduction current higher than a given demarcation current value. The identified memory cells are shut down by pulling their associated bit lines to ground. In other words, those cells having higher conduction current and irrelevant to the present sensing are identified and have their current shut down before the actual data of the current sensing is read.

Therefore there is a general need for high performance and high capacity non-volatile memory with reduced power consumption. In particular, there is a need for a compact non-volatile memory with enhanced read and program performance that is power efficient.

SUMMARY OF INVENTION

These needs for a high capacity and high performance non-volatile memory device are met by having a large page of read/write circuits to read and write a corresponding page of memory cells in parallel. In particular, interactive noise effects inherent in high density chip integration that may introduce errors into reading and programming are either eliminated or minimized.

Source line bias is an error introduced by a non-zero resistance in the ground loop of the read/write circuits. The error is caused by a voltage drop across the resistance of the source path to the chip's ground when current flows.

According to one aspect of the invention, when a page of memory cells are sensed in parallel and their sources are coupled together to receive the cell source signal at an aggregate access node, the operating voltage supplied to the bit line has the same reference point as the aggregate access node rather than the chip's ground. In this way any source bias differences between the aggregate access node and the chip's ground will be tracked and compensated for in the supplied bit line voltage.

According to another aspect of the invention, when a page of memory cells are sensed in parallel and their sources are coupled to the same page source line, the operating voltage supplied to the bit line is referenced with respect to an access node of the page source line rather than the chip's ground. In this way any source bias differences from the access node to the chip's ground will be tracked and compensated for in the supplied bit line voltage.

According to yet another aspect of the invention, when a page of memory cells are sensed in parallel and their sources are coupled together to receive the cell source signal at an aggregate access node, the operating voltage supplied to the word line has the same reference point as the aggregate access node rather than the chip's ground. In this way any source bias differences between the aggregate access node and the chip's ground will be tracked and compensated for in the word line voltage.

According to yet another aspect of the invention, when a page of memory cells are sensed in parallel and their sources are coupled to the same page source line, the operating voltage supplied to the word line is referenced with respect to an access node of the page source line rather than the chip's ground. In this way any source bias differences from the access node to the chip's ground will be tracked and compensated for in the supplied word line voltage.

In one preferred voltage control circuit to track and compensate for the source bias, the voltage control circuit references its base voltage with respect to either the aggregate access node or the page access node. Its output voltage is generated by a reference current $I_{REF}$ across an adjustable resistor. A cascode current mirror circuit 730 is employed to maintain $I_{REF}$ constant over the range of $V_{BLC}$.

In another preferred voltage control circuit to track and compensate for the source bias, the voltage control circuit references its base voltage with respect to either the aggregate access node or the page access node. The control circuit uses a potential divider on a reference voltage to obtain a desired output voltage. The reference voltage is driven by a regulated output driver before having its output level controlled by a DAC-controlled potential divider 840 to produce a programmed output voltage.

Additional features and advantages of the present invention will be understood from the following description of its preferred embodiments, which description should be taken in conjunction with the accompanying drawings.

BRIEF DESCRIPTION OF THE DRAWINGS

FIGS. 1A–1E illustrate schematically different examples of non-volatile memory cells.

FIG. 2 illustrates an example of an NOR array of memory cells.

DETAILED DESCRIPTION OF THE PREFERRED EMBODIMENTS

Figure 6A:
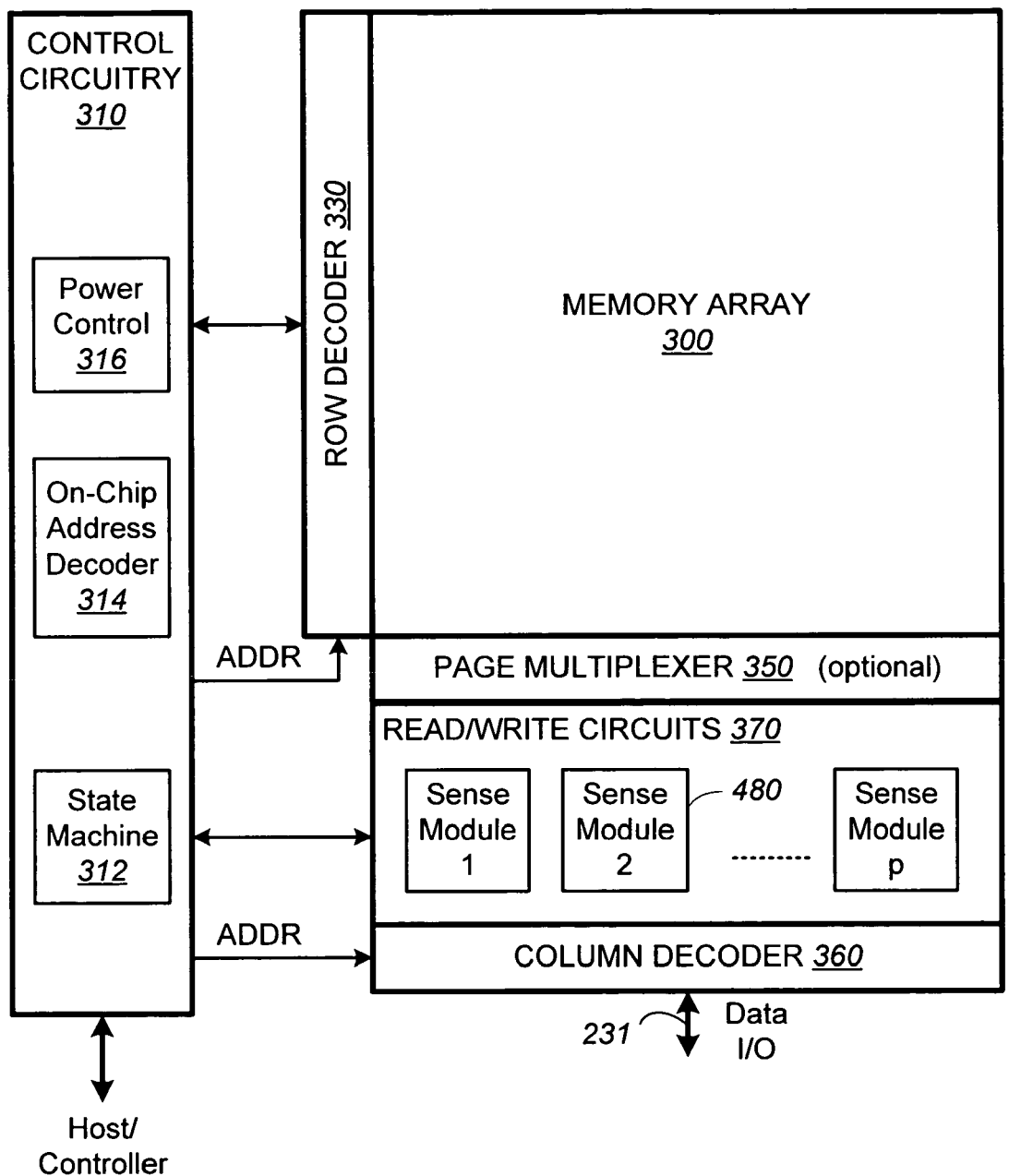
FIG. 6A illustrates schematically a compact memory device having a bank of read/write circuits, which provides the context in which the present invention is implemented.

FIG. 6A illustrates schematically a compact memory device having a bank of read/write circuits, which provides the context in which the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of sense modules 480 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 6B:
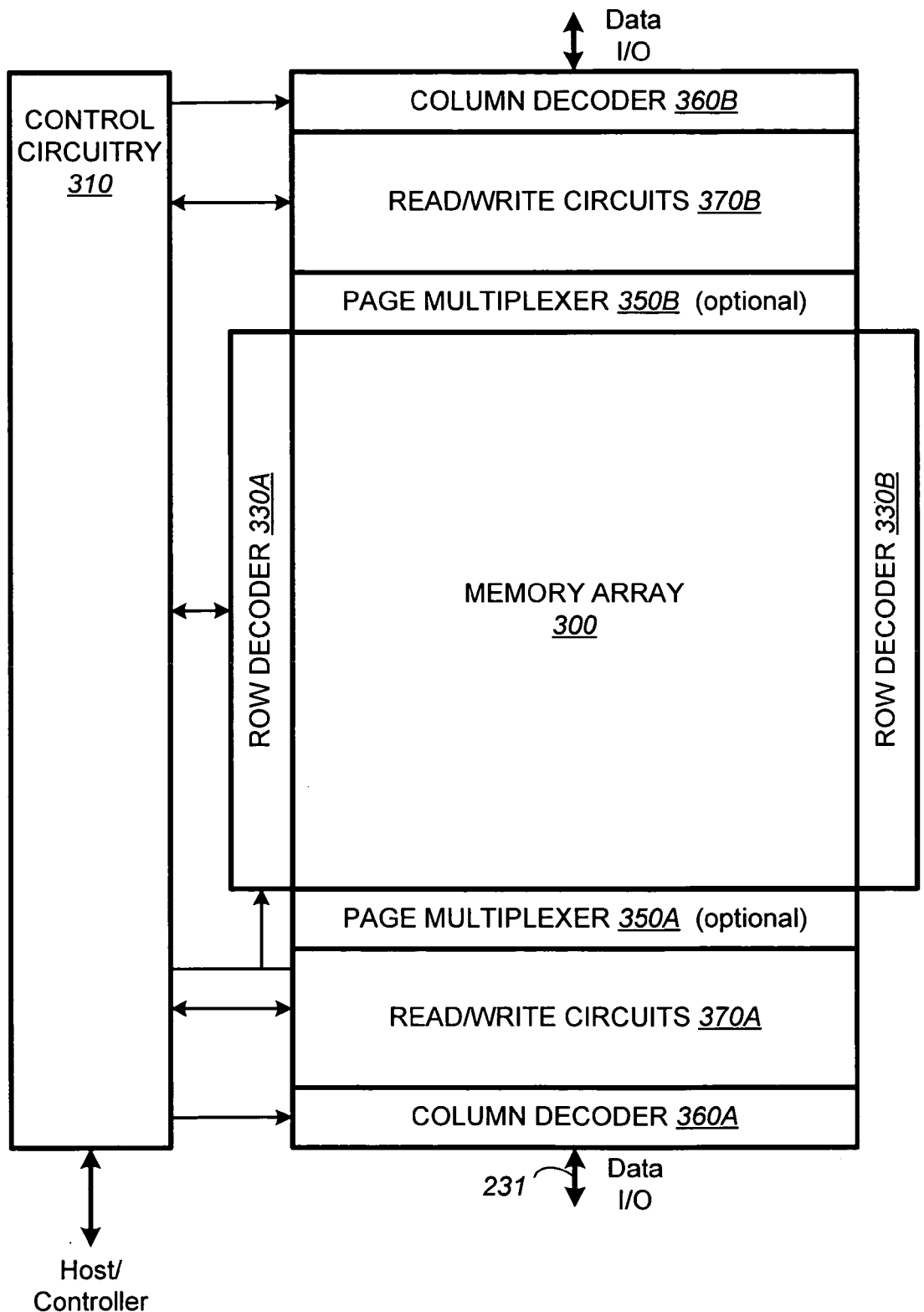
FIG. 6B illustrates a preferred arrangement of the compact memory device shown in FIG. 6A.

FIG. 6B illustrates a preferred arrangement of the compact memory device shown in FIG. 6A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the bank of sense modules 480, is essentially reduced by one half.

The entire bank of p sense modules 480 operating in parallel allows a block (or page) of p cells along a row to be read or programmed in parallel. One example memory array may have p=512 bytes (512×8 bits). In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module includes a sense amplifier for sensing the conduction current of a memory cell. A preferred sense amplifier is disclosed in United States Patent Publication No. 2004-0109357-A1 incorporated herein by reference.

Source Line Error Management

One potential problem with sensing memory cells is source line bias. When a large number memory cells are sensed in parallel, their combine currents can result in significant voltage drop in a ground loop with finite resistance. This results in a source line bias which causes error in a sensing operation employing threshold voltage sensing. Also, if the cell is operating close to the linear region, the conduction current is sensitive to the source-drain voltage once in that region, and the source line bias will cause error in a sensing operation when the drain voltage is offset by the bias.

Figure 7A:
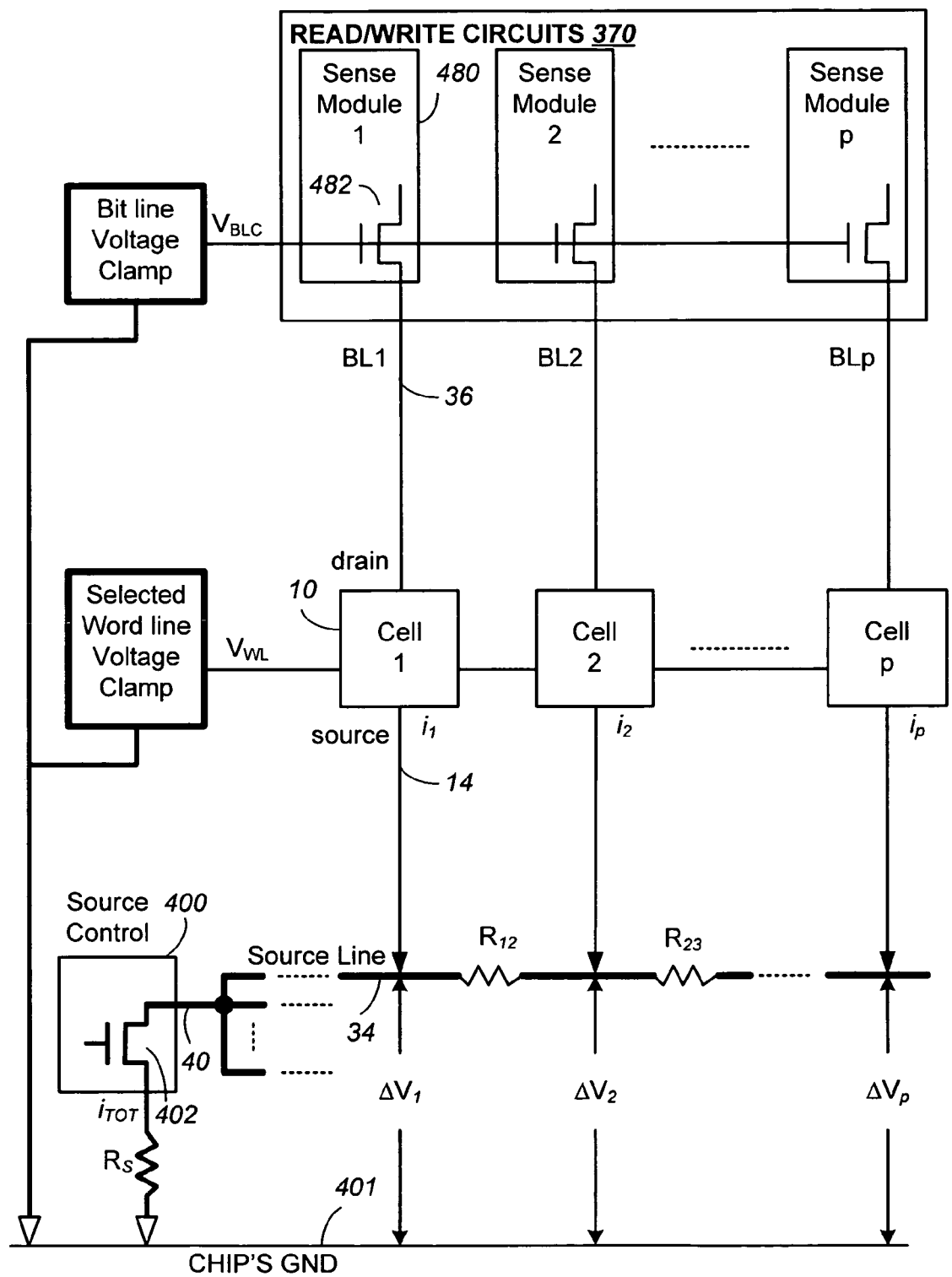
FIG. 7A illustrates a conventional arrangement in which a bit line voltage control, a word line voltage control and a source voltage control are all referencing from the same ground of the IC memory chip.

FIG. 7A illustrates a conventional arrangement in which a bit line voltage control, a word line voltage control and a source voltage control are all referencing from the same ground of the IC memory chip. The read/write circuits 370 operate on a page of memory cells simultaneously. Each sense module 480 in the read/write circuits is coupled to a corresponding cell via a bit line, such as a bit line 36. For example, a sense module 480 senses the conduction current $i_1$ (source-drain current) of a memory cell 10. The conduction current flows from the sense module through the bit line 36 into the drain of the memory cell 10 and out from the source 14 before going through a source line 34 and a consolidated source line 40 and then to the chip's ground 401 via a source control circuit 400. The source line 34 typically joins all the sources of the memory cells in a page along a row in a memory array. In an integrated circuit chip, the source lines 34 of the individual rows in a memory array are all tied together as multiple branches of the consolidated source line 40 connected to the source control circuit 400. The source control circuit 400 has a pull-down transistor 402 controlled to pull the consolidated source line 40 to the chip's ground 401, which is ultimately connected to an external ground pad (e.g. Vss pad) of the memory chip. Even when metal strapping is used to reduce the resistance of the source line, a non-zero resistance R remains between the source electrode of a memory cell and the ground pad. Typically, the average ground loop resistance R can be as high as 50 ohm.

Figure 1D:
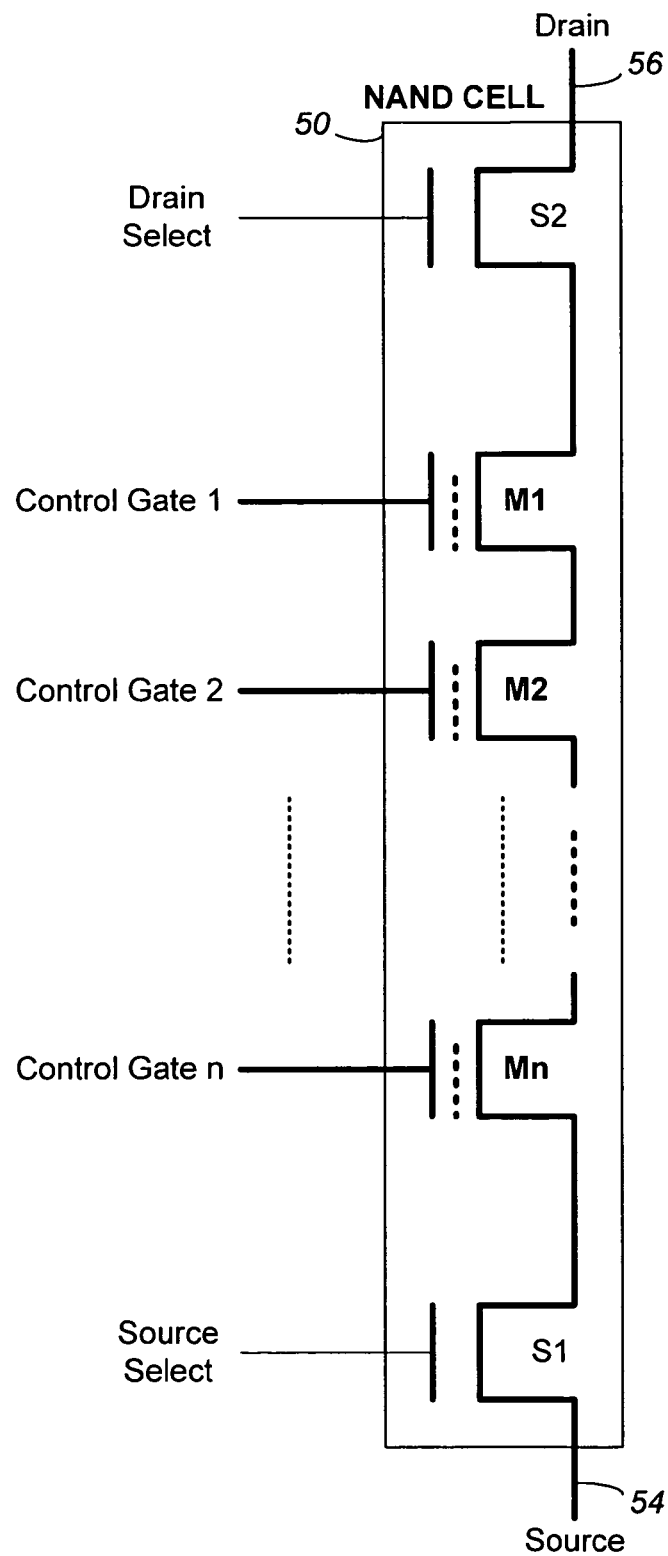
Figure 3:
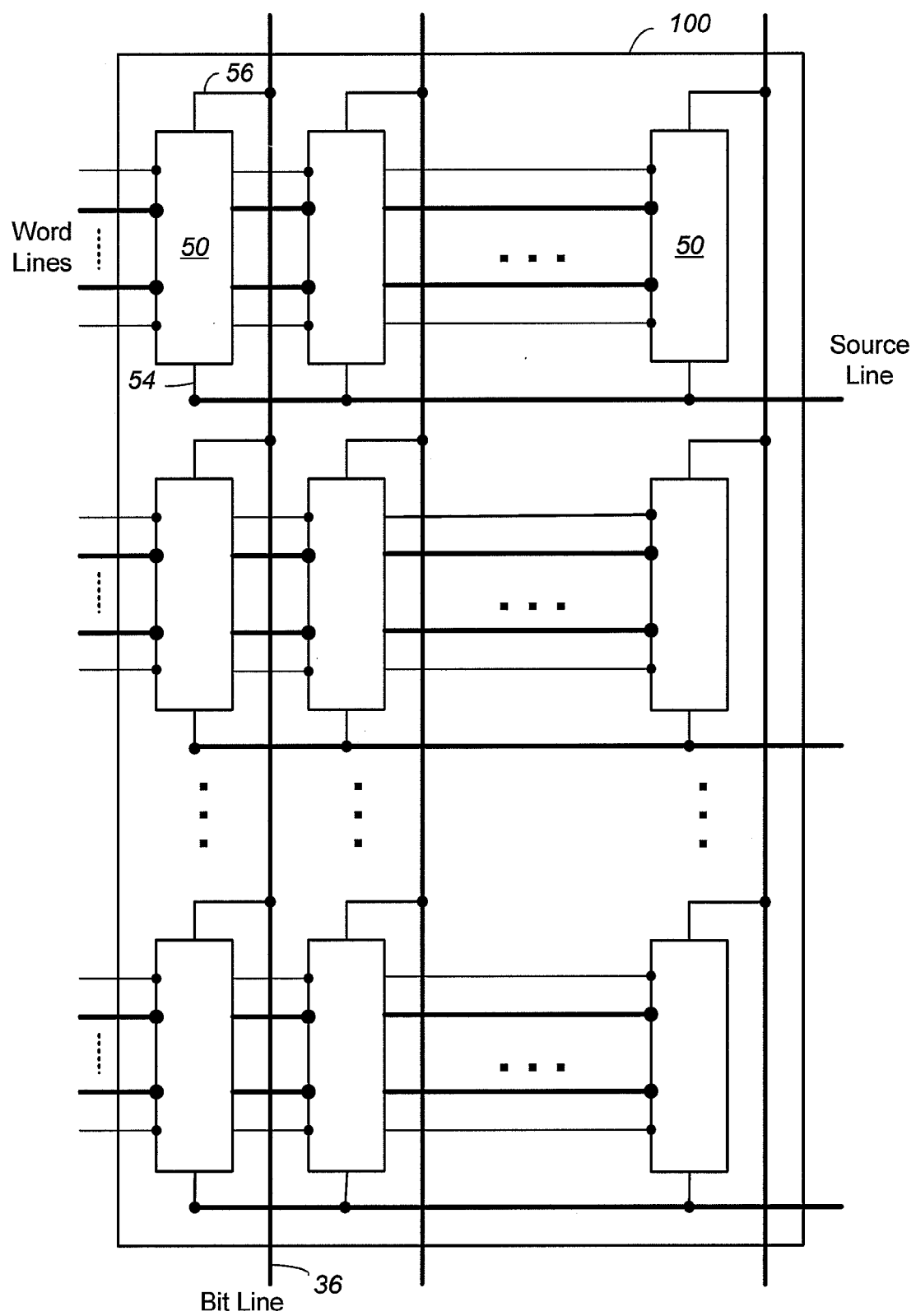
FIG. 3 illustrates an example of an NAND array of memory cells, such as that shown in FIG. 1D.
Figure 4:
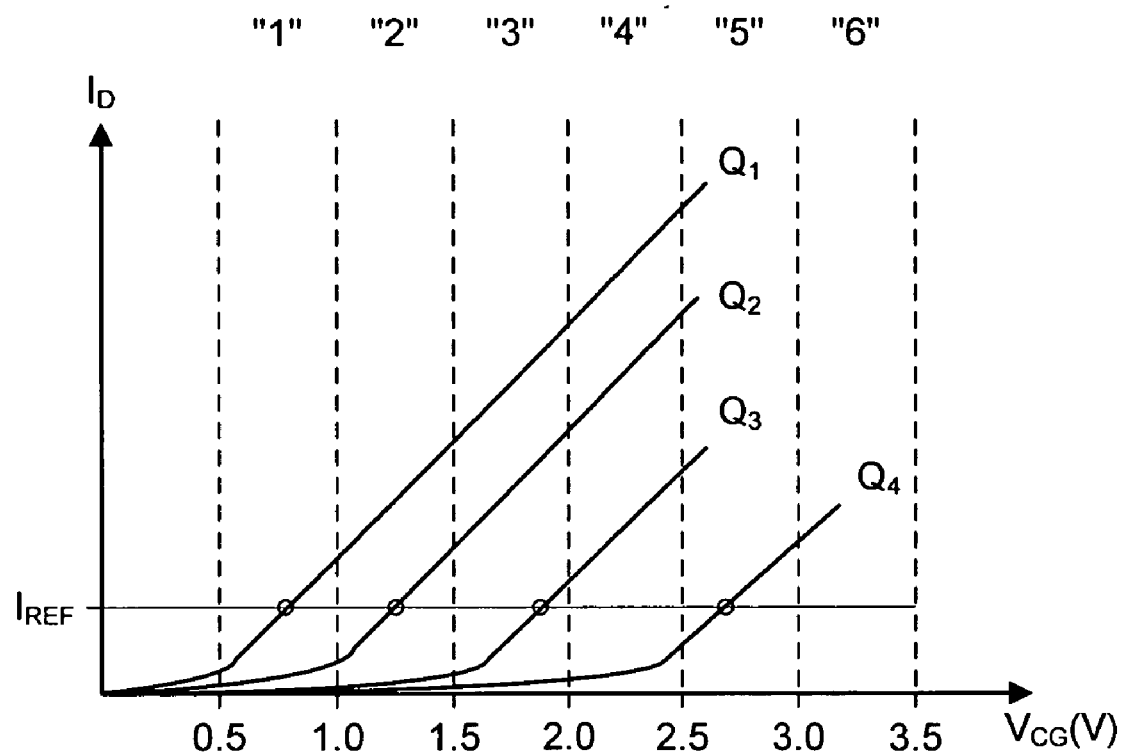
FIG. 4 illustrates the relation between the source-drain current and the control gate voltage for four different charges Q1–Q4 that the floating gate may be storing at any one time.
Figure 5:
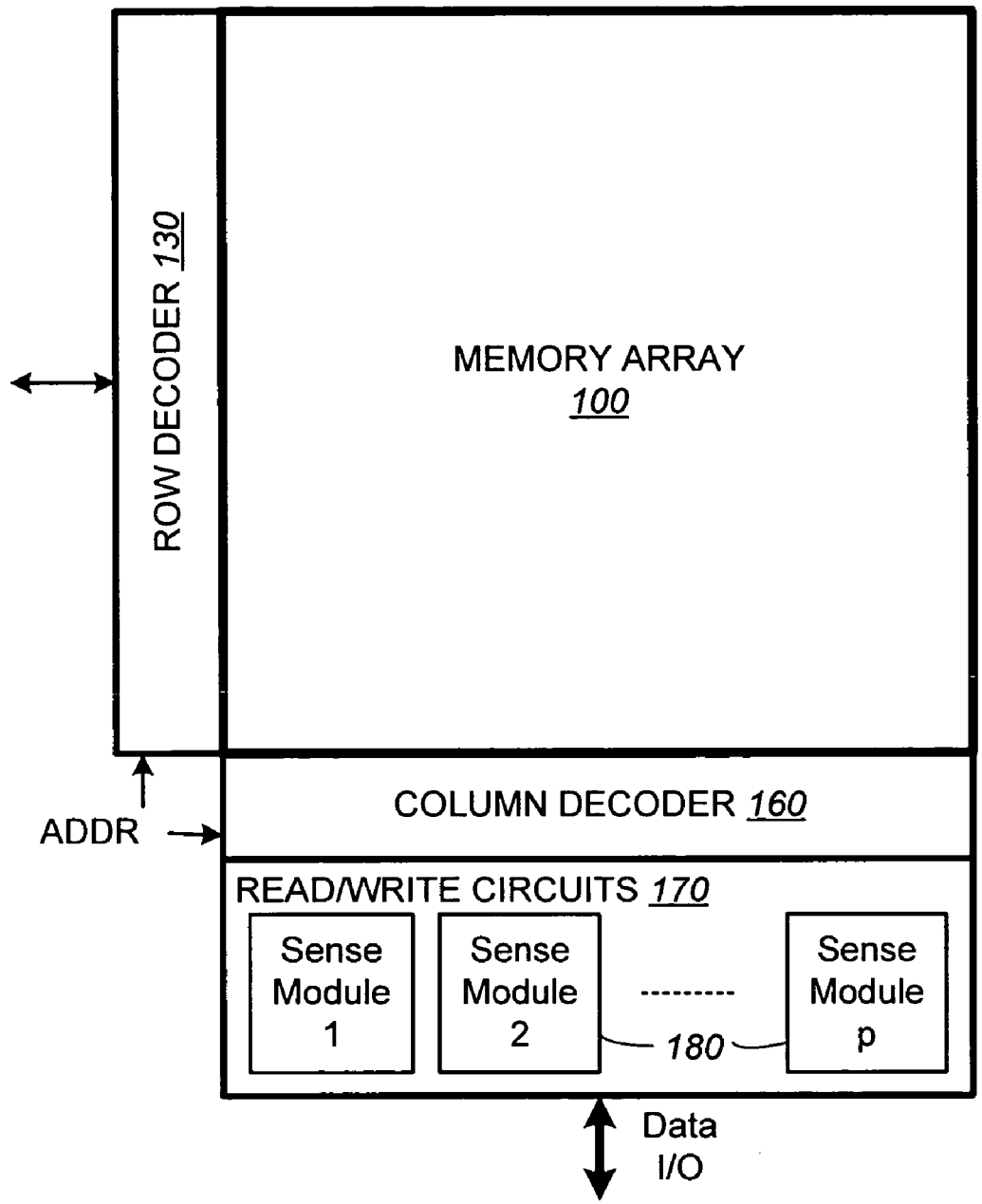
FIG. 5 illustrates schematically a typical arrangement of a memory array accessible by read/write circuits via row and column decoders.

For the entire page of memory being sensed in parallel, the total current flowing through the consolidated source line 40 is the sum of all the conduction currents, i.e. $i_{TOT}=i_1+i_2+\ldots,+i_p$. Generally each memory cell has a conduction current dependent on the amount of charge programmed into its charge storage element. For a given control gate voltage of the memory cell, a smaller programmed charge will yield a comparatively higher conduction current (see FIG. 4.) When a finite resistance exists in the path between the source electrode of a memory cell and the ground pad, the voltage drop across the resistance is given by $V_{drop}\sim i_{TOT}R$.

For example, if 4,256 bit lines discharge at the same time, each with a current of 1 μA, then the source line voltage drop will be equal to 4000 lines×1 μA/line×50 ohms ~0.2 volts. This means instead of being at ground potential, the effective source is now at 0.2V. Since the bit line voltage and the word line voltage are referenced with respect to the same chip's ground 401, this source line bias of 0.2 volts will have both the effective drain voltage and control gate voltage reduced by 0.2V.

Figure 7B:
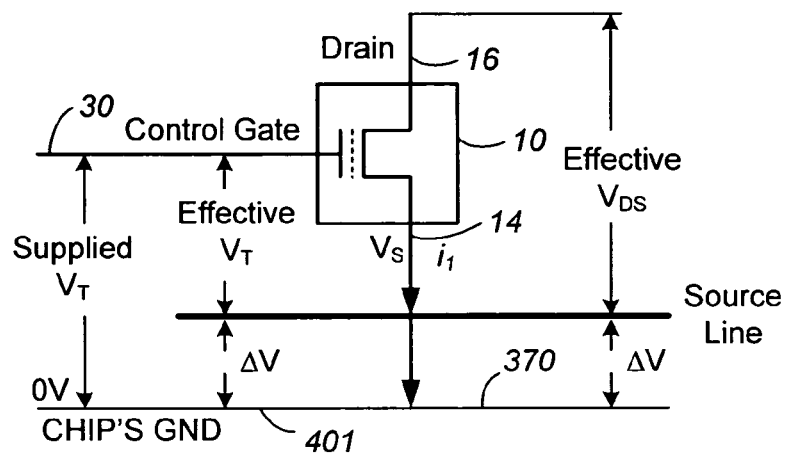
FIG. 7B illustrates the error in both the gate voltage and drain voltage of a memory cell caused by a source line voltage drop.

FIG. 7B illustrates the error in the threshold voltage level of a memory cell caused by a source line voltage drop. The threshold voltage $V_T$ supplied to the control gate 30 of the memory cell 10 is relative to the chip's ground 401. However, the effective $V_T$ seen by the memory cell is the voltage difference between its control gate 30 and source 14. There is a difference of approximately $V_{drop}$ or ΔV between the supplied and effective $V_T$ (ignoring the smaller contribution of voltage drop from the source 14 to the source line.) This ΔV or source line bias will contribute to a sensing error of, for example 0.2 volts when threshold voltages of the memory cells are sensed. This bias cannot be easily removed as it is data-dependent, i.e., dependent on the memory states of the memory cells of the page.

FIG. 7B also illustrates the error in the drain voltage level of a memory cell caused by a source line voltage drop. The drain voltage applied to the drain 16 of the memory cell 10 is relative to the chip's ground 401. However, the effective drain voltage, $V_{DS}$, seen by the memory cell is the voltage difference between its drain 16 and source 14. There is a difference of approximately ΔV between the supplied and effective $V_{DS}$. This ΔV or source line bias will contribute to a sensing error when the memory cells are sensed in an operating region sensitive to $V_{DS}$. As described above, this bias cannot be easily removed as it is data-dependent, i.e., dependent on the memory states of the memory cells of the page.

Figure 8:
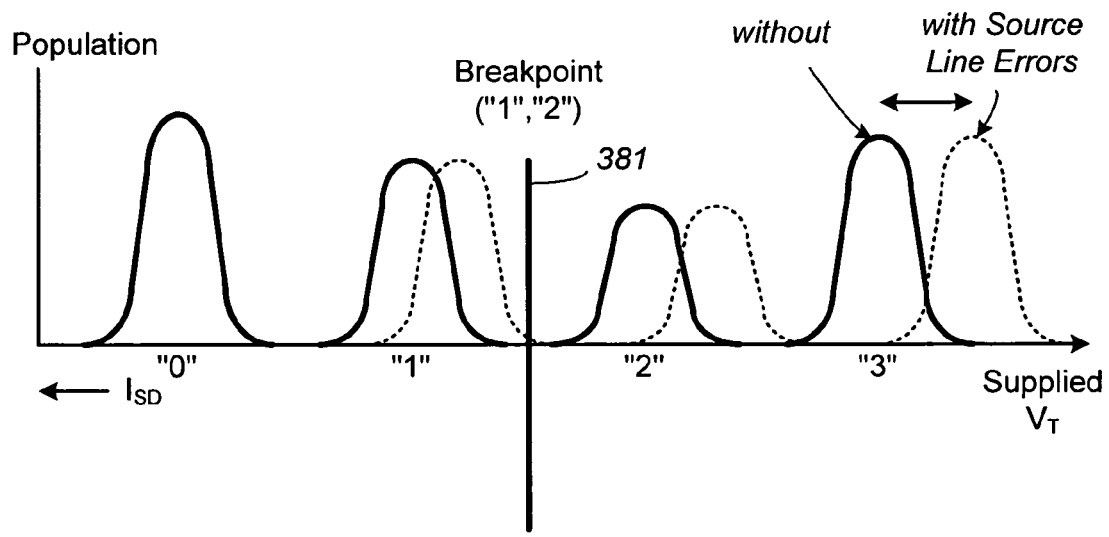
FIG. 8 illustrates the effect of source bias errors in an example population distribution of a page of memory cells for a 4-state memory.

FIG. 8 illustrates the effect of source bias errors in an example population distribution of a page of memory cells for a 4-state memory. Each cluster of memory state is programmed within a range of conduction currents $I_{SD}$ clearly separated from each other. For example, a breakpoint 381 is a demarcating current value between two clusters, respectively representing the "1" and "2" memory states. A necessary condition for a "2" memory state will be that it has a conduction current less than the breakpoint 381. If there were no source line bias, the population distribution with respect to the supplied threshold voltage $V_T$ will be given by the curve with the solid line. However, because of the source line bias error, the effective threshold voltage of each of the memory cells at its control gate is reduced from the supplied voltage relative to ground by the source line bias $\Delta V$. Similarly, the effective drain voltage is also reduced from the supplied voltage by the source line bias.

The source line bias results in a shifting of the distribution (broken line) towards a higher supplied $V_T$ to make up for the shortfall in the effective voltage. The shifting will be more for that of the higher (lower current) memory states. If the breakpoint 381 is designed for the case without source line error, then the existence of a source line error will have some of the tail end of "1" states having conduction currents to appear in a region of no conduction, which means higher than the breakpoint 381. This will result in some of the "1" states (more conducting) being mistakenly demarcated as "2" states (less conducting.)

Drain Compensation of Source Line Bias

According to one aspect of the invention, when a page of memory cells are sensed in parallel and their sources are coupled together to receive the cell source signal at an aggregate access node, the operating voltage supplied to the bit line has the same reference point as the aggregate access node rather than the chip's ground. In this way any source bias differences between the aggregate access node and the chip's ground will be tracked and compensated for in the supplied bit line voltage.

Generally, the source path from each memory cell to the chip's ground varies over a range since each memory cell will have a different network path to the chip's ground. Also the conduction current of each memory cell depends on the data programmed into it. Even among the memory cells of a page, there will be some variations in the source bias. However, when the reference point is taken as close to the memory cells' sources as possible, the errors will at least be minimized.

Figure 9A:
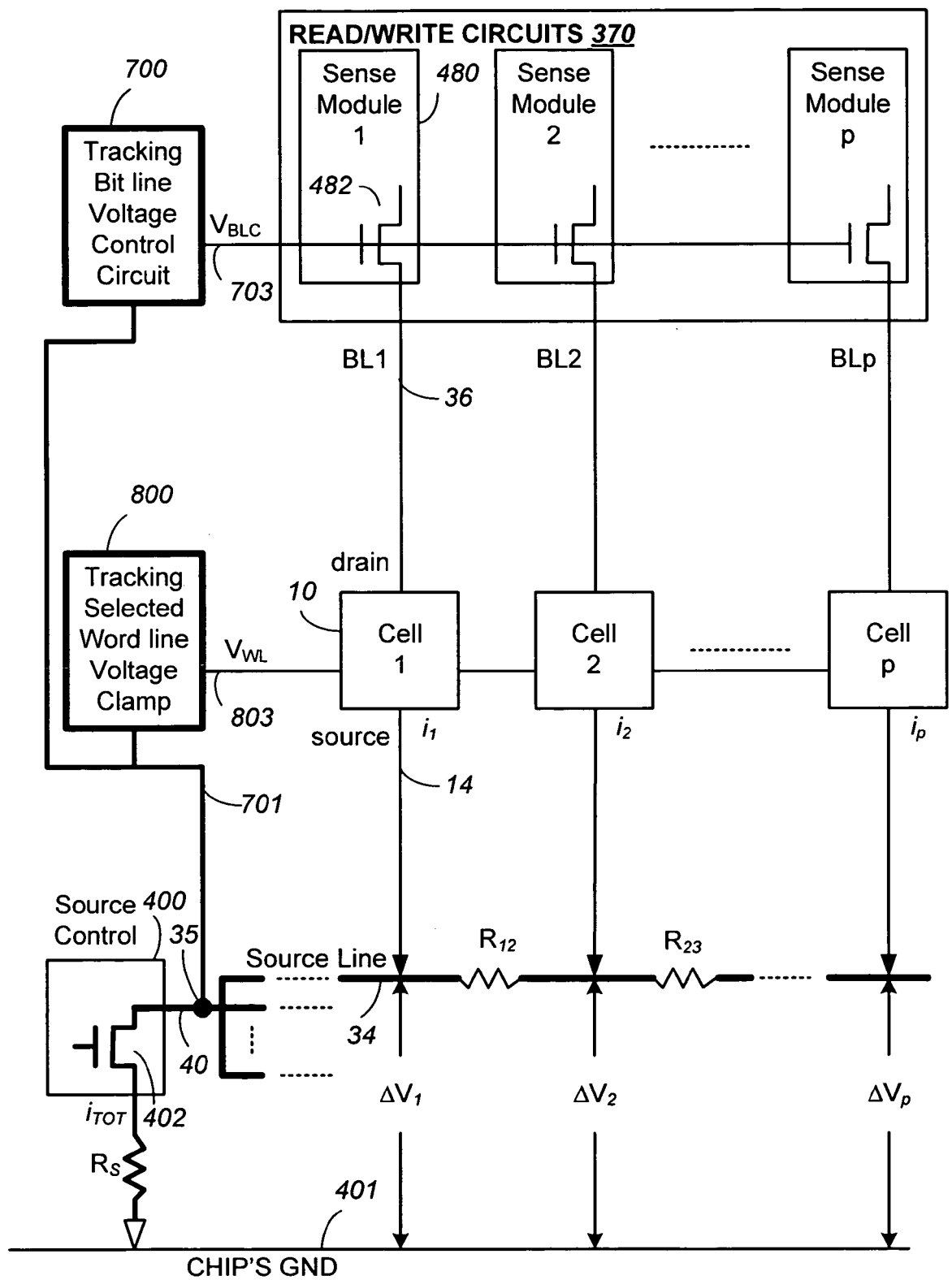
FIG. 9A illustrates an arrangement in which a bit line voltage control and/or a word line voltage control are compensated for source bias by having a reference point at the node where cell source signal accesses the source lines, according to one preferred embodiment of the invention.

FIG. 9A illustrates an arrangement in which a bit line voltage control and/or a word line voltage control are compensated for source bias by having a reference point at the node where cell source signal accesses the source lines, according to one preferred embodiment of the invention. Similar to FIG. 7A, the read/write circuits 370 operate on a page of memory cells simultaneously. Each sense module 480 in the read/write circuits is coupled to a corresponding cell via a bit line, such as a bit line 36. A page source line 34 is coupled to the source of each memory cell of the page along a row in the memory array. Multiple rows have their page source lines coupled together and to the source control circuit 400 via an aggregate access node 35. The source control circuit 400 has a pull-down transistor 402 controlled to pull the aggregate access node 35 and therefore the page source line 34 to the chip's ground 401 through a ground path formed by a consolidated source line with resistance $R_S$. The ground 401 is ultimately connected to an external ground pad (e.g. Vss pad) of the memory chip. Thus, the source control circuit 400 controls the cell source signal at the aggregate access node 35. Due to the finite resistance ground path, the cell source signal is not at 0V but has a source bias of $\Delta V_1$.

A bit line voltage control embodied as a tracking bit line voltage clamp 700 is implemented to compensate for the data dependent source bias. This is accomplished by generating an output voltage $V_{BLC}$ in an output 703 that is referencing at the same point as the cell source signal at the aggregate access node 35 instead of the external ground pad. In this way, at least the source bias due to the resistance $R_S$ of the consolidated source line is eliminated.

According to another aspect of the invention, when a page of memory cells are sensed in parallel and their sources are coupled to the same page source line, the operating voltage supplied to the bit line is referenced with respect to an access node of the page source line rather than the chip's ground. In this way any source bias differences from the page access node to the chip's ground will be tracked and compensated for in the supplied bit line voltage.

Figure 9B:
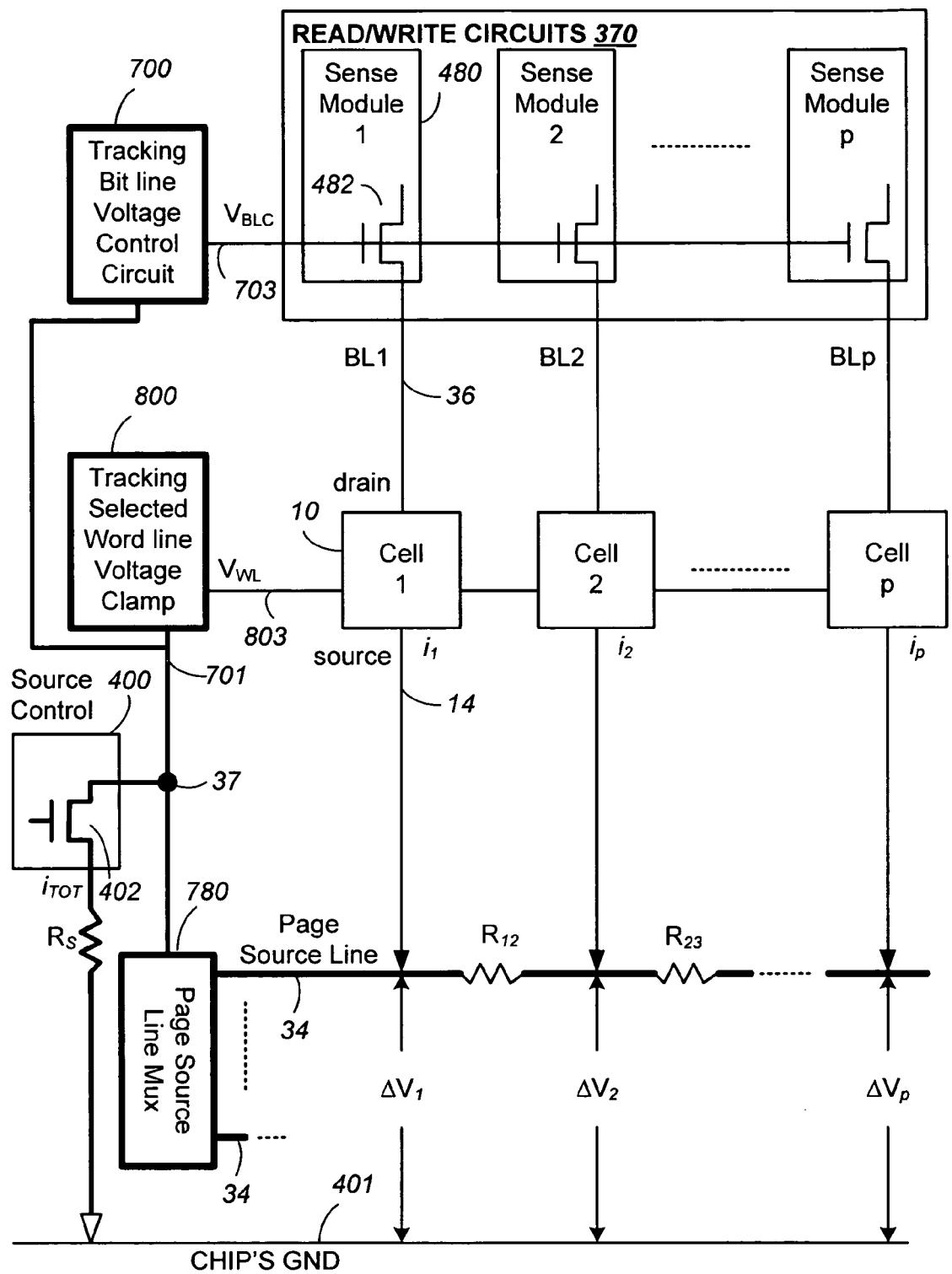
FIG. 9B illustrates a bit line voltage control and a word line voltage control are compensated for source bias by referencing with respect to a page source line, according to another preferred embodiment of the invention.

FIG. 9B illustrates a bit line voltage control and a word line voltage control are compensated for source bias by referencing with respect to a page source line, according to another preferred embodiment of the invention.

The arrangement is similar to that of FIG. 9A except the reference point for the bit line voltage control 700 and word line voltage control 800 is now taken essentially at the selected page source line. A page source line multiplexor 780 is used to selectively couple the selected page source line to a page access node 37, which serves as the reference point.

A bit line voltage control embodied as a tracking bit line voltage clamp 700 is implemented to compensate for the data dependent source bias. This is accomplished by generating an output voltage $V_{BLC}$ in an output 703 that is referencing with respect to the voltage at the access node 38 of the page source line 34 instead of referencing to the external ground pad. In this way, the source bias is better corrected due the location of the reference point at the access node 37, which is specific to the page.

Figure 10:
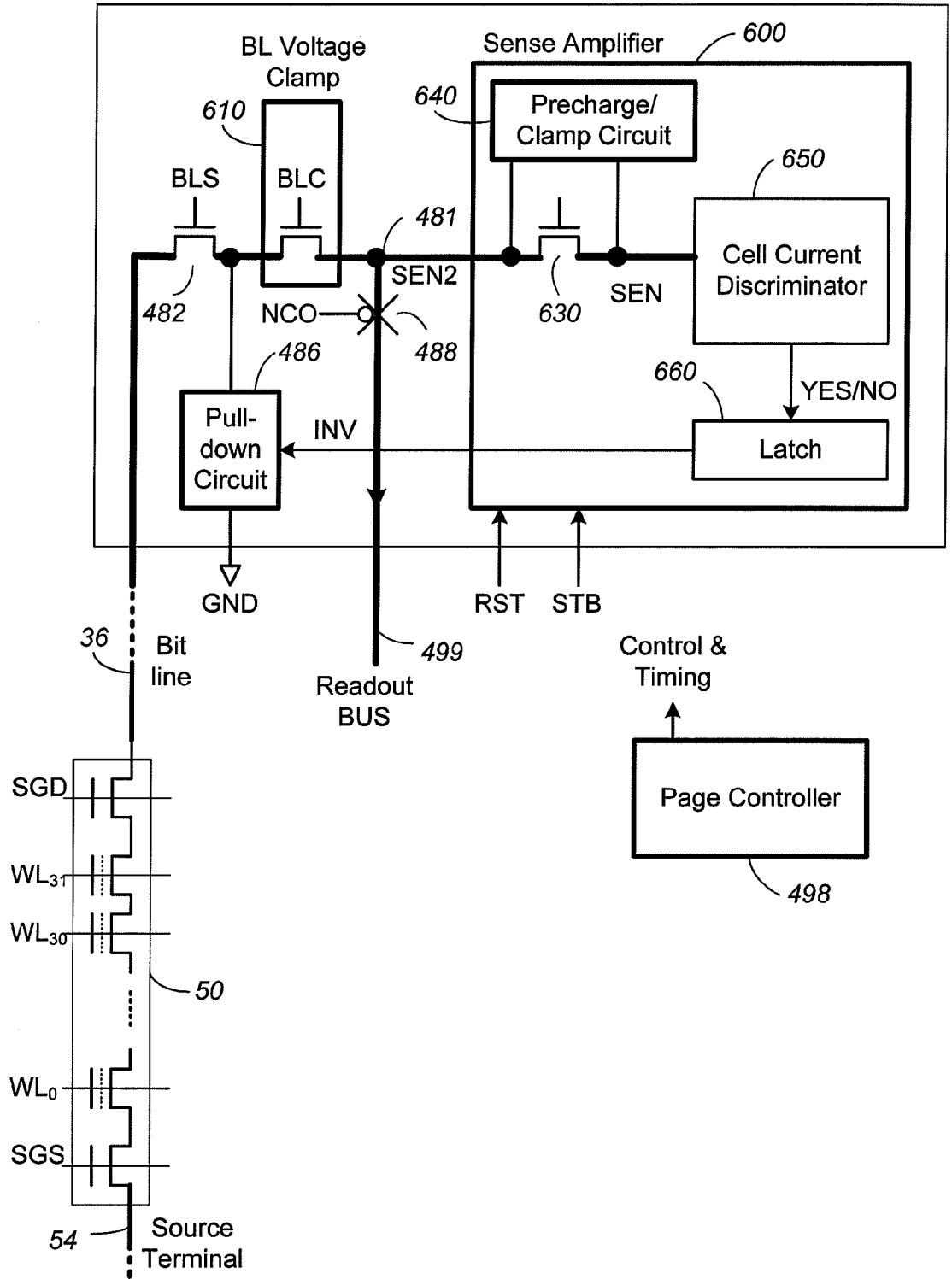
FIG. 10 is a schematic diagram of a preferred sense module shown in FIGS. 9A and 9B that operates in combination with the tracking bit line voltage control circuit to provide a bit line voltage compensated for source bias.

FIG. 10 is a schematic diagram of a preferred sense module shown in FIGS. 9A and 9B that operates in combination with the tracking bit line voltage control circuit to provide a bit line voltage compensated for source bias. In the example shown, the sense module 480 senses the conduction current of a memory cell in a NAND chain 50 via a coupled bit line 36. It has a sense node 481 that can be selectively coupled to a bit line, a sense amplifier 600 or a readout bus 499. Initially, an isolation transistor 482, when enabled by a signal BLS connects the bit line 36 to the sense node 481. The sense amplifier 600 senses the sense node 481. The sense amplifier includes a precharge/clamp circuit 640, a cell current discriminator 650 and a latch 660.

The sense module 480 enables the conduction current of the selected memory cell in the NAND chain to be sensed. The conduction current is a function of the charge programmed into the memory cell and the applied $V_T(i)$ when there exists a nominal voltage difference between the source and drain of the memory cell. Prior to sensing, the voltages to the gates of the selected memory cell must be set via the appropriate word lines and bit line.

The precharge operation starts with the unselected word line charging to a voltage Vread followed by charging the selected word line to a predetermined threshold voltage $V_T(i)$ for a given memory state under consideration.

Then the precharged circuit 640 brings the bit line voltage to a predetermined drain voltage appropriate for sensing. This will induce a source-drain conduction current to flow in the selected memory cell in the NAND chain 50, which is detected from the channel of the NAND chain via a coupled bit line 36.

When the $V_T(i)$ voltage is stable, the conduction current or the programmed threshold voltage of the selected memory cell can be sensed via the coupled bit line 36. The sense amplifier 600 is then coupled to the sense node to sense the conduction current in the memory cell. The cell current discriminator 650 serves as a discriminator or comparator of current levels. It effectively determines whether the conduction current is higher or lower than a given demarcation current value $I_0(j)$. If it is higher, the latch 660 is set to a predetermined state with the signal INV=1.

A pull-down circuit 486 is activated in response to the latch 660 setting the signal INV to HIGH. This will pull down the sense node 481 and therefore the connected bit line 36 to ground voltage. This will inhibit the conduction current flow in the memory cell 10 irrespective of the control gate voltage since there will be no voltage difference between its source and drain.

As shown in FIGS. 9A and 9B, there will be a page of memory cells being operated on by a corresponding number of sense modules 480. A page controller 498 supplies control and timing signals to each of the sense modules. The page controller 498 cycles each of the sense module 480 through a predetermined sequence of operations and also supplies a predetermined demarcation current value $I_0(j)$ during the operations. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass modules 480. Similar sense modules have been disclosed in U.S. patent application Ser. No. 11/015,199 filed Dec. 16, 2004 by Cernea et al., entitled "IMPROVED MEMORY SENSING CIRCUIT AND METHOD FOR LOW VOLTAGE OPERATION". The entire disclosure of U.S. patent application Ser. No. 11/015,199 is herein incorporated by reference.

The sense module 480 incorporates a constant voltage supply and maintains the bit line at constant voltage during sensing in order to avoid bit line to bit line coupling. This is preferably implemented by the bit line voltage clamp 610. The bit line voltage clamp 610 operates like a diode clamp with a transistor 612 in series with the bit line 36. Its gate is biased to a constant voltage $V_{BLC}$ equal to the desired bit line voltage $V_{BL}$ above its threshold voltage $V_{TN}$. In this way, it isolates the bit line from the sense node 481 and set a constant voltage level for the bit line, such as the desired $V_{BL}$=0.4 to 0.7 volts. In general the bit line voltage level is set to a level such that it is sufficiently low to avoid a long precharge time, yet sufficiently high to avoid ground noise and other factors such as operating in the saturated region where $V_{DC}$ is above 0.2 volts.

Thus, when operating at a low $V_{BL}$, especially one that approaching the linear region, it is important that $V_{BL}$ is accurately rendered, as small variations can lead to significant changes in conduction currents. This means $V_{BLC}=V_{BL}+V_{TN}$ must be accurately set to minimize the source line bias.

Figure 11:
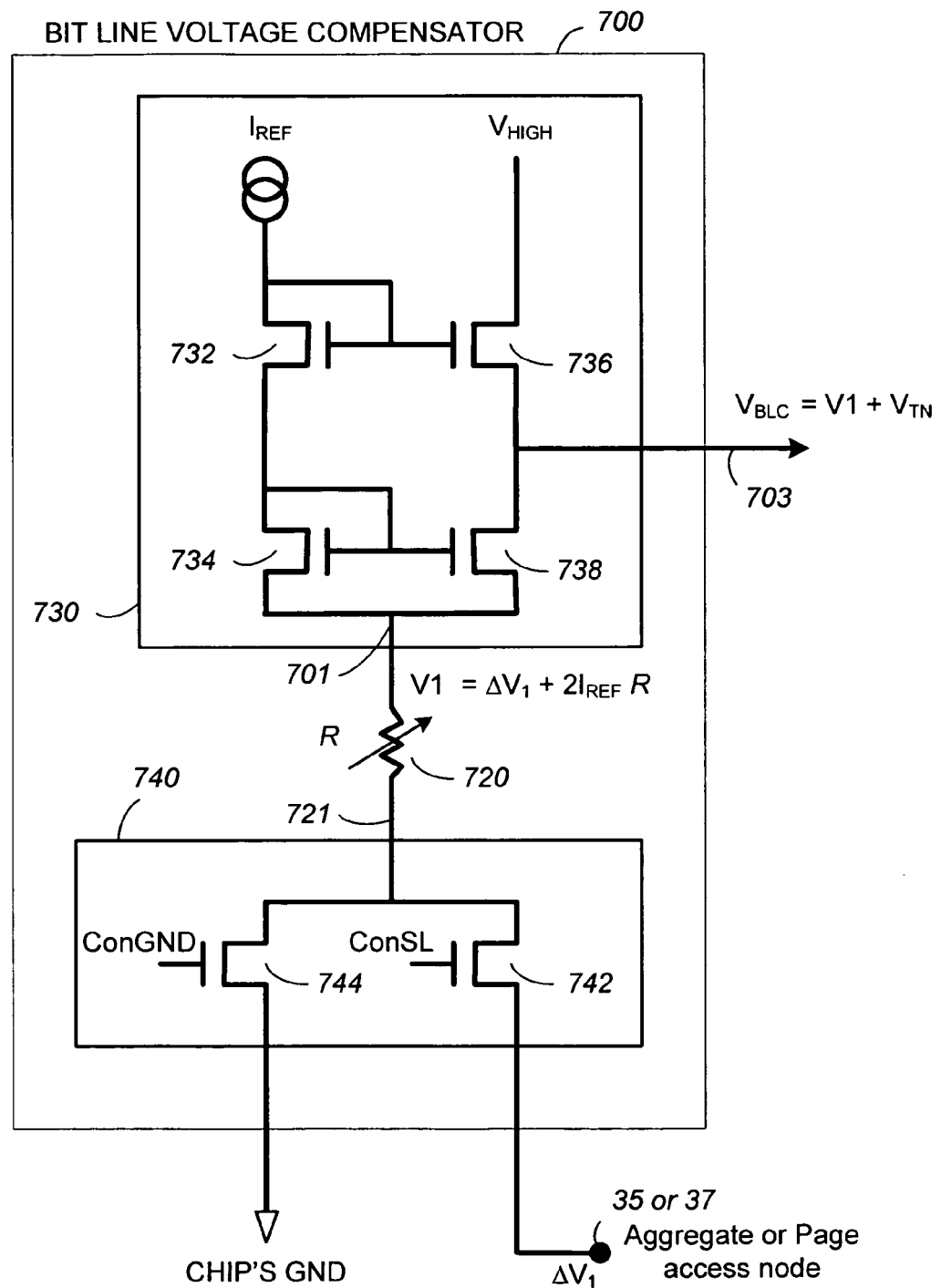
FIG. 11 illustrates a preferred embodiment of the tracking bit line voltage control circuit shown in FIGS. 9A and 9B.

FIG. 11 illustrates a preferred embodiment of the tracking bit line voltage control circuit shown in FIGS. 9A and 9B. The tracking bit line voltage control circuit 700 basically provides an output voltage $V_{BLC}$ on an output line 703. The output voltage is essentially generated by a reference current $I_{REF}$ across an adjustable resistor R 720. A cascode current mirror circuit 730 is employed to maintain $I_{REF}$ constant over the range of $V_{BLC}$. The cascode current mirror circuit 730 has two branches, with a first branch formed by two n-transistors 732, 734 connected as diodes in series and a second, mirrored branch formed by two other n-transistors 736, 738 connected in series. The gates of the transistors 732 and 736 are interconnected, and the gates of the transistors 734 and 738 are interconnected. An $I_{REF}$ source is connected to the drain of the transistor 732 so that $I_{REF}$ flows down the first branch and is also mirrored in the second branch. A $V_{HIGH}$ source is connected to the drain of the transistor 736. The sources of the transistors 734 and 738 are interconnected to form a base rail 701.

The output voltage is taken from a tap between the serially connected transistors 736 and 738. If the voltage of the base rail 701 is at V1, then $V_{BLC}$=V1+$V_{TN}$. This is because the voltage on the drain of the transistor 734 is V1 plus a threshold voltage of the n-transistor, and the same $I_{REF}$ is also mirrored in the second branch, resulting in the same voltage appearing on the drain of the transistor 738.

The voltage V1 at the base rail 701 is set by the voltage drop across the resistor R 720 due to the current $2I_{REF}$ plus a base voltage at the node 721. The base voltage at node the 721 is selectable by a base voltage selector 740. The base voltage selector 740 selectively connects the node 721 to the aggregate access node 35 (see FIG. 9A) or to the page access node 37 of the page source line (see FIG. 9B) via a transistor 742 when a control signal ConSL is asserted at its gate. Alternatively, the selector circuit 720 selectively connects the node 721 to ground 401 via a transistor 744 when a control signal ConGND is asserted at its gate. Thus, it will be seen that when the signal ConSL is asserted, V1=$\Delta V_1$+$2I_{REF}$R, and the output of the tracking bit line voltage control circuit, $V_{BLC}$=$\Delta V_1$+$2I_{REF}$R+$V_{TN}$. In the case of controlling the bit line voltage clamp 610 (see FIG. 10), the n-transistor 734 is chosen to have the same $V_{TN}$ as that of the transistor forming the bit line voltage clamp 610. The resistor R is then adjusted so that the desired bit line voltage $V_{BL}$ is set by $2I_{REF}$R. By referencing with respect to the aggregate access node 35 or the page access node 37, a significant portion of source bias $\Delta V_1$ that is above ground potential will be compensated automatically in $V_{BLC}$.

Control Gate Compensation of Source Line Bias

According to yet another aspect of the invention, when a page of memory cells are sensed in parallel and their sources are coupled together to receive the cell source signal at an aggregate access node, the operating voltage supplied to the word line has the same reference point as the aggregate access node rather than the chip's ground. In this way any source bias differences between the aggregate access node and the chip's ground will be tracked and compensated for in the supplied word line voltage.

As shown in FIG. 9A, a word line voltage control embodied as a tracking word line voltage clamp 800 is implemented to compensate for the data dependent source bias. This is accomplished by generating an output voltage $V_{WL}$ in an output 803 that is referencing at the same point as the cell source signal at the aggregate node 35 instead of the external ground pad. In this way, at least the source bias due to the resistance of the consolidated source line (see FIG. 7A) is eliminated.

According to yet another aspect of the invention, when a page of memory cells are sensed in parallel and their sources are coupled to the same page source line, the operating voltage supplied to the word line is referenced with respect to an access node of the page source line rather than the chip's ground. In this way any source bias differences from the page access node to the chip's ground will be tracked and compensated for in the supplied word line voltage.

As shown in FIG. 9B, a word line voltage control embodied as a tracking word line voltage clamp 800 is implemented to compensate for the data dependent source bias. This is accomplished by generating an output voltage $V_{WL}$ in an output 803 that is referencing at the same point as the access node 38 to the selected page source line instead of the external ground pad. In this way, the source bias is better corrected due the location of the reference point at the access node 38, which is specific to the page.

Figure 12:
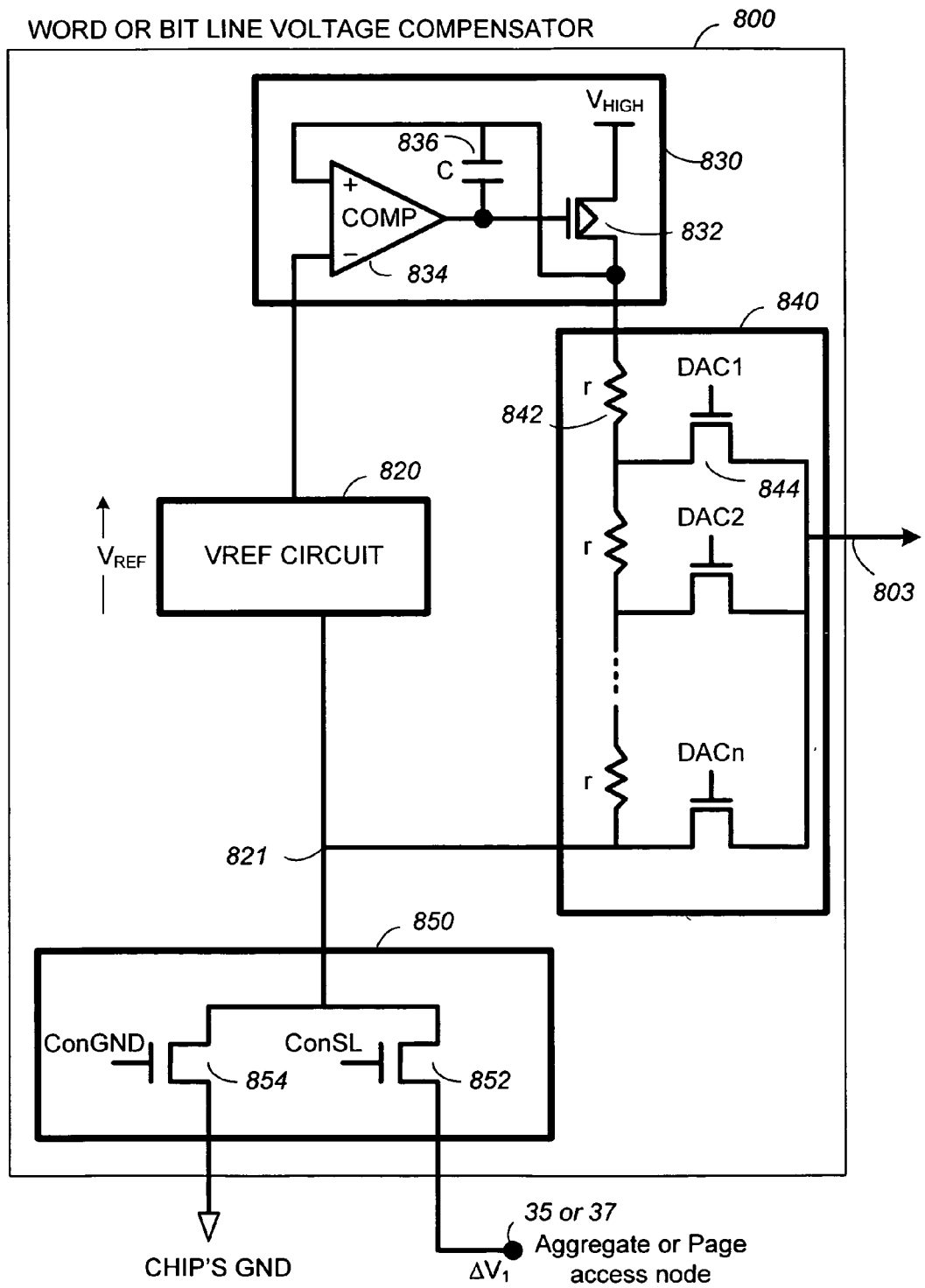
FIG. 12 illustrates a preferred embodiment of the tracking word line voltage control circuit shown in FIGS. 9A and 9B.

FIG. 12 illustrates a preferred embodiment of the tracking word line voltage control circuit shown in FIGS. 9A and 9B. The tracking word line voltage control circuit 800 essentially uses a potential divider on a reference voltage to obtain a desired output voltage $V_{WL}$ on an output 803. A reference voltage $V_{REF}$ is provided by a VREF circuit 820. $V_{REF}$ is driven by a regulated output driver 830. The output level of the driven $V_{REF}$ is controlled by a DAC-controlled potential divider 840 to produce a programmed $V_{WL}$ at the output 803.

The regulated output driver 830 includes a p-transistor 832 driving an output from a comparator 834. The drain of the p-transistor 832 is connected to a voltage source, $V_{HIGH}$ and its gate is controlled by the output of the comparator 834. The comparator 834 receives VREF at its "−" terminal and compares it with a signal fed back from the source of the p-transistor. Also, a capacitor 836 is used to AC couple the output of the comparator with the "+" terminal. If the voltage at the source of the p-transistor 832 is less than $V_{REF}$, the output of the comparator is low, turning on the p-transistor 832, which results in the voltage at the source rising to the level of $V_{REF}$. On the other hand, if $V_{REF}$ is exceeded, the comparator output will turn off the p-transistor 832 to effect regulation, so that a driven, regulated $V_{REF}$ appears across the potential divider 840. The potential divider 840 is formed by a series of resistors; each tap between any two resistors is switchable to the output 803 by a transistor such as transistor 844 that is turned on by a signal such as DAC1. In this way, by selectively connecting the output 803 to a tap in the potential divider, a desired fraction of $V_{REF}$ can be obtained; i.e., $(n*r/r_{TOT})*V_{REF}$, where n is the number of r DAC setting selected.

$V_{REF}$ and therefore $V_{WL}$ are referenced with respect to a node 821. The base voltage at the node 821 is selectable by a base voltage selector 850. The base voltage selector 740 selectively connects the node 721 to the aggregate access node 35 (see FIG. 9A) or to the page access node 37 of the page source line (see FIG. 9B) via a transistor 742 when a control signal ConSL is asserted at its gate. Alternatively, the selector circuit 850 selectively connects the node 821 to ground 401 via a transistor 854 when a control signal ConGND is asserted at its gate. Thus, it will be seen that when the signal ConSL is asserted, $\Delta V_1$ will appear at the node 821, which will become the base voltage for the VREF circuit 820 and the voltage divider 840. Therefore the output of the tracking word line voltage control circuit 800 will have $V_{WL}=(n*r/r_{TOT})*V_{REF}+\Delta V_1$. By referencing with respect to the aggregate access node 35 or the page access node 37, a significant portion of source bias $\Delta V_1$ that is above ground potential will be compensated automatically in $V_{WL}$.

The tracking voltage control circuit 800 can alternatively be employed to track the source bias for the $V_{BLC}$ used in controlling the bit line voltage clamp 610 (see FIG. 10). Essentially, the output voltage is set to provide $V_{BL}+V_{TN}+\Delta V_1$.

Although the various aspects of the present invention have been described with respect to certain embodiments, it is understood that the invention is entitled to protection within the full scope of the appended claims.

What is claimed is:

1. In a non-volatile memory device having individual pages of memory cells to be sensed in parallel, each memory cell having a source, a drain, a charge storage unit and a control gate for controlling a conduction current along said drain and source, a method of sensing a page of memory cells, comprising:
   providing a page source line to each individual page;
   coupling the source of each memory cell of each individual page to its page source line;
   coupling the page source lines of individual pages to an aggregate node for connection to a source voltage control circuit for sensing operation;
   coupling the drain of each memory cell of said page to an associated bit line; and
   providing a predetermined bit line voltage to the associated bit line of each memory cell of said page for sensing operation, wherein each said predetermined bit line voltage is referenced with respect to said aggregate node so as not to be affected by any voltage differences between said aggregate node and a ground reference.

2. The method of sensing as in claim 1, wherein said page source line is at a higher potential than that of said source voltage control circuit.

3. The method of sensing as in claim 1, wherein said source voltage control circuit is referenced with respect to said ground reference.

4. The method of sensing as in claim 1, wherein said providing a predetermined bit line voltage further comprises:
   providing a bit line voltage clamp; and
   generating a control voltage to control the bit line voltage clamp to clamp the bit line at the predetermined bit line voltage.

5. The method of sensing as in claim 4, wherein said generating a control voltage further comprises:
   providing a reference current;
   providing a predetermined resistor; and
   generating the control voltage by passing the reference current across the predetermined resistor.

6. The method of sensing as in claim 4, wherein said providing a predetermined bit line voltage clamp includes:
   providing a first transistor having a source, drain and control gate and having a diode voltage drop across the control gate and the source;
   coupling a voltage supply to the drain of the first transistor;
   coupling the associated bit line to the source of the first transistor; and
   applying the control voltage to the control gate of the first transistor such that the control voltage has a value given by the predetermined bit line voltage plus the diode voltage drop.

7. The method of sensing as in claim 6, wherein said generating a control voltage further comprises:
   providing a reference current;
   providing a predetermined resistor;
   providing a second transistor having a substantially similar diode voltage drop as that of the first transistor; and
   generating the control voltage by summing the voltage drop across the second transistor and the voltage drop created by passing the reference current across the predetermined resistor.

8. The method of sensing as in claim 6, wherein said generating a control voltage further comprises:
   providing a regulated reference voltage;
   providing a DAC-controlled potential divider; and
   generating the control voltage by dividing said regulated reference voltage using the DAC-controlled potential divider.

9. The method as in any one of claims 1–8, wherein each of said memory cells stores one bit of data.

10. The method as in any one of claims 1–8, wherein each of said memory cells stores more than one bit of data.

11. A non-volatile memory device having individual pages of memory cells to be sensed in parallel, each memory cell having a source, a drain, a charge storage unit and a control gate for controlling a conduction current along said drain and source, said memory device, comprising:
 a page source line coupled to the source of each memory cell in a page;
 an aggregate node coupled to individual page source lines;
 a source voltage control circuit coupled via said aggregate node to a page source line of a selected page for memory operation;
 an associated bit line coupled to the drain of each memory cell of said page; and
 a bit line voltage supply for providing a predetermined bit line voltage to the associated bit line of each memory cell of said page for sensing operation, wherein each said predetermined bit line voltage is referenced with respect to said aggregate node so as not to be affected by any voltage differences between said aggregate node and a ground reference.

12. The memory device as in claim 11, wherein said page source line is at a higher potential than that of said source voltage control circuit.

13. The memory device as in claim 11, wherein said source voltage control circuit is referenced with respect to said ground reference.

14. The memory device as in claim 11, wherein said bit line voltage supply further comprises:
 a bit line voltage clamp; and
 a control voltage generator for generating a control voltage to control the bit line voltage clamp to clamp the bit line at the predetermined bit line voltage.

15. The memory device as in claim 14, wherein said control voltage generator further comprises:
 a reference current;
 a predetermined resistor; and
 the control voltage generated is a function of the reference current and the predetermined resistor.

16. The memory device as in claim 14, wherein said bit line voltage clamp includes:
 a first transistor having a source, drain and control gate and having a diode voltage drop across the control gate and the source;
 a voltage supply coupled to the drain of the first transistor;
 the associated bit line coupled to the source of the first transistor; and
 the control voltage applied to the control gate of the first transistor such that the control voltage has a value given by the predetermined bit line voltage plus the diode voltage drop.

17. The memory device as in claim 16, wherein said control voltage generator further comprises:
 a reference current;
 a predetermined resistor;
 a second transistor having a substantially similar diode voltage drop as that of the first transistor; and
 the control voltage generated is a function of the voltage drop across the second transistor and the voltage drop created by passing the reference current across the predetermined resistor.

18. The memory device as in claim 16, wherein said control voltage generator further comprises:
 a regulated reference voltage;
 a DAC-controlled potential divider; and
 an output control voltage given by dividing said regulated reference voltage using the DAC-controlled potential divider.

19. The memory device as in any one of claims 11–18, wherein each of said memory cells stores one bit of data.

20. The memory device as in any one of claims 11–18, wherein each of said memory cells stores more than one bit of data.

21. In a non-volatile memory device having individual pages of memory cells to be sensed in parallel, each memory cell having a source, a drain, a charge storage unit and a control gate for controlling a conduction current along said drain and source, a method of sensing a page of memory cells, comprising:
 providing a page source line;
 coupling the source of each memory cell of said page to said page source line;
 switching said page source line to a source voltage control circuit for sensing operation;
 coupling the drain of each memory cell of said page to an associated bit line; and
 providing a predetermined bit line voltage to the associated bit line of each memory cell of said page for sensing operation, wherein each said predetermined bit line voltage is referenced with respect to said page source line of said page so as not to be affected by any voltage differences between the page source line and a ground reference.

22. The method of sensing as in claim 21, wherein said page source line is at a higher potential than that of said source voltage control circuit.

23. The method of sensing as in claim 21, wherein said source voltage control circuit is referenced with respect to said ground reference.

24. The method of sensing as in claim 21, wherein said providing a predetermined bit line voltage further comprises:
 providing a bit line voltage clamp; and
 generating a control voltage to control the bit line voltage clamp to clamp the bit line at the predetermined bit line voltage.

25. The method of sensing as in claim 24, wherein said generating a control voltage further comprises:
 providing a reference current;
 providing a predetermined resistor; and
 generating the control voltage by passing the reference current across the predetermined resistor.

26. The method of sensing as in claim 24, wherein said providing a predetermined bit line voltage clamp includes:
 providing a first transistor having a source, drain and control gate and having a diode voltage drop across the control gate and the source;
 coupling a voltage supply to the drain of the first transistor;
 coupling the bit line to the source of the first transistor; and
 applying the control voltage to the control gate of the first transistor such that the control voltage has a value given by the predetermined bit line voltage plus the diode voltage drop.

27. The method of sensing as in claim 26, wherein said generating a control voltage further comprises:
 providing a reference current;
 providing a predetermined resistor;

providing a second transistor having a substantially similar diode voltage drop as that of the first transistor; and generating the control voltage by summing the voltage drop across the second transistor and the voltage drop created by passing the reference current across the predetermined resistor.

28. The method of sensing as in claim 26, wherein said generating a control voltage further comprises:

providing a regulated reference voltage;

providing a DAC-controlled potential divider; and generating the control voltage by dividing said regulated reference voltage using the DAC-controlled potential divider.

29. The method as in any one of claims 21–28, wherein each of said memory cells stores one bit of data.

30. The method as in any one of claims 21–28, wherein each of said memory cells stores more than one bit of data.

31. A non-volatile memory device having individual pages of memory cells to be sensed in parallel, each memory cell having a source, a drain, a charge storage unit and a control gate for controlling a conduction current along said drain and source, said memory device, comprising:

a page source line coupled to the source of each memory cell in a page;

a page source line multiplexor;

a source voltage control circuit coupled via said page source line multiplexor to a page source line of a selected page for memory operation;

an associated bit line coupled to the drain of each memory cell of said page; and a bit line voltage supply for providing a predetermined bit line voltage to the associated bit line of each memory cell of said page for sensing operation, wherein each said predetermined bit line voltage is referenced with respect to said page source line so as not to be affected by any voltage differences between said page source line and a ground reference.

32. The memory device as in claim 31, wherein said page source line is at a higher potential than that of said source voltage control circuit.

33. The memory device as in claim 31, wherein said source voltage control circuit is referenced with respect to said ground reference.

34. The memory device as in claim 31, wherein said bit line voltage supply further comprises:

a bit line voltage clamp; and a control voltage generator for generating a control voltage to control the bit line voltage clamp to clamp the bit line at the predetermined bit line voltage.

35. The memory device as in claim 34, wherein said control voltage generator further comprises:

a reference current;

a predetermined resistor; and the control voltage generated is a function of the reference current and the predetermined resistor.

36. The memory device as in claim 34, wherein said bit line voltage clamp includes:

a first transistor having a source, drain and control gate and having a diode voltage drop across the control gate and the source;

a voltage supply coupled to the drain of the first transistor;

the associated bit line coupled to the source of the first transistor; and the control voltage applied to the control gate of the first transistor such that the control voltage has a value given by the predetermined bit line voltage plus the diode voltage drop.

37. The memory device as in claim 36, wherein said control voltage generator further comprises:

a reference current;

a predetermined resistor;

a second transistor having a substantially similar diode voltage drop as that of the first transistor; and the control voltage generated is a function of the voltage drop across the second transistor and the voltage drop created by passing the reference current across the predetermined resistor.

38. The memory device as in claim 36, wherein said control voltage generator further comprises:

a regulated reference voltage;

a DAC-controlled potential divider; and an output control voltage given by dividing said regulated reference voltage using the DAC-controlled potential divider.

39. The memory device as in any one of claims 31–38, wherein each of said memory cells stores one bit of data.

40. The memory device as in any one of claims 31–38, wherein each of said memory cells stores more than one bit of data.

* * * * *